(12) United States Patent
Chang

(10) Patent No.: US 7,411,447 B2
(45) Date of Patent: Aug. 12, 2008

(54) DYNAMIC PULSE WIDTH MODULATION AMPLIFIERS

(75) Inventor: Lin-Jing Chang, Tainan (TW)

(73) Assignee: Biforst Technology Inc., HsinChu (TW)

( * ) Notice: Subject to any disclaimer, the term of this patent is extended or adjusted under 35 U.S.C. 154(b) by 149 days.

(21) Appl. No.: 11/331,095

(22) Filed: Jan. 13, 2006

(65) Prior Publication Data

US 2006/0158248 A1 Jul. 20, 2006

(30) Foreign Application Priority Data

Jan. 17, 2005 (TW) .............................. 94101344 A

(51) Int. Cl.
*H03F 3/38* (2006.01)
(52) U.S. Cl. ..................................... 330/10; 330/207 A
(58) Field of Classification Search ................... 330/10, 330/207 A, 251; 363/41; 375/238
See application file for complete search history.

(56) References Cited

U.S. PATENT DOCUMENTS 7,102,426 B2 * 9/2006 Kitamura ..................... 330/10
7,206,343 B2 * 4/2007 Pearce ......................... 375/238

* cited by examiner

*Primary Examiner*—Khanh V Nguyen
(74) *Attorney, Agent, or Firm*—Birch, Stewart, Kolasch & Birch, LLP

(57) ABSTRACT

A dynamic pulse width modulation (PWM) amplifier comprising an input terminal, a dynamic PWM controller, a power stage, a low pass filter, and an output terminal. The input terminal receives an input signal. The dynamic PWM controller transforms the N-bit input signal sampled by a sampling frequency to a 1-bit PWM signal. The power stage receives and outputs the 1-bit PWM signal. The low pass filter receives and outputs the 1-bit PWM signal. The 1-bit PWM signal is used to drive the power stage and the low pass filter. The output terminal outputs the 1-bit PWM signal. The dynamic PWM amplifier is characterized in the dynamic PWM amplifier uses a register array to store the input signal processed immediately in each frame, regroups the input signal, and outputs the regroup signal, so that the 1-bit PWM signal is changed according to the input signal.

5 Claims, 5 Drawing Sheets

DYNAMIC PULSE WIDTH MODULATION AMPLIFIERS

BACKGROUND OF THE INVENTION

1. Field of the Invention

The present invention relates to a dynamic pulse width modulation (PWM) amplifier, and in particular relates to a dynamic PWM controller.

2. Description of the Related Art

Generally, power amplifiers are divided into four classes: A, B, AB, and C. A class-A amplifier has an output transistor, the operating point of which is in the center of the linear region. The current obtained by the class-A amplifier from a voltage source is constant and does not vary with the level of an input signal. Because the amplitude of an output signal is changed continuously when the class-A amplifier is used to amplify an audio frequency, the class-A amplifier has low efficiency of not more than 25% in practice. Amplification by the class-A amplifier can be performed by a signal-transistor or a pull-push circuit. The class-A amplifier has no crossover distortion and no switching distortion, and the harmonic mainly comprises an even harmonic. The tone quality is thick at a low pitch, smooth at a median, and clear at a high pitch. The class-A amplifier is not popularly used to amplify power due to the large power consumption, low efficiency, easy heating, and greater heat dissipation requirement. Moreover, components within the class-A amplifier have low reliability and short life when they operate with in high current and high temperature over a long period of time, and the class-A amplifier has high cost. Thus, class-A amplifiers are no longer produced. A simple class-A amplifier has only one active component, such as a transistor. Because a bias voltage current is applied to the transistor, it is not completely turned on or off. The non-turned on/off region is referred to as a linear region. An amplifier which operates in the linear region has low distortion, but low efficiency.

A class-B amplifier has a bias voltage circuit, so that pull-push transistors within the class-B amplifier have low current when there is no any driving signal. When a driving signal is provided, the current of one of the two transistors is increased and the other is turned off in the first half period. In the second half period, the operations of the two transistors are exchanged. Because the two transistors operate alternately, a pull-push circuit is required to completely amplify the wave form of signals. The class-B amplifier has high efficiency with efficiency of 78% being the highest in theory. The class-B amplifier, however, has large distortion. The class-B amplifier comprises two transistors which pull and push each other, one outputs current and the other receives current. When a sine wave which is symmetrical with respect to the zero point is to be amplified, one of the transistors is used to amplify the upper half portion of the sine wave, and the other is used to amplify the lower half portion thereof. The two transistors operate alternately to accomplish the amplification operations. The class-B amplifier thus has higher efficiency than a class-A amplifier. However, some undesired problems of the class-B amplifier occu in a non-linear region wherein the sine wave only passes through the zero point. In the non-linear region, one of the two transistors is only just turned on, and the other is only just turned off. Since the transistors require a short transition period to turn on, singles are distorted in the non-linear region.

A class-AB amplifier serves as a class-A amplifier when the level of its driving signal is lower, and it transfers to serve as a class-B amplifier when the level of its driving signal becomes higher. The efficiency of the class-AB amplifier is higher than the class-A amplifier when a small signal serves as an input signal. In the class-AB amplifier, the efficiency is increased as the output power increases. Although there is more distortion in the class-AB amplifier than in the class-A amplifier, the class-AB amplifier is still used, wherein a class-AB of high bias current is popularly used to reduce the distortion of a low level signal. In the configuration of the class-AB amplifier, the class-AB amplifier is composed of a class-A amplifier and a class-B amplifier. The configuration is similar to class-B amplifier, and a circuit which provides small bias current to each transistor is further applied in the class-AB amplifier, so that each transistor is not completely turned off. The class-AB amplifier with high bias current has large power consumption as the class-A amplifier, but it has lesser distortion than class-A amplifier. The class-AB amplifier requires two transistors as the class-B amplifier. The performance of the class-AB amplifier is thus better.

A class-C amplifier has an active component which is turned on in a duration of a small portion of an input signal. The class-C amplifier thus requires a tuned circuit to return the other portions of the input signal by the flywheel effect of the tuned circuit. The class-C amplifier has great distortion, the power of the collector of the class-C amplifier is, however, the greatest. The class-C amplifier is thus used in frequency multiplication circuits or stages of power amplifying. In practice, the oscillation frequency of the class-C amplifier is usually limited by a quartz oscillator with a single output frequency. To raise output frequency, a frequency multiplier is applied to vary the shifting value of the oscillation frequency or FM signal frequency in an integer multiple. The frequency multiplier outputs signal frequency to a non-linear circuit and then obtains required the high-order harmonic from the distorted output wave using a high-multiple resonance frequency set by a resonance circuit. In general, class-C amplifiers with the characteristic of non-linear and resonance circuits operate in coordination to serve as frequency multiplication circuits.

BRIEF SUMMARY OF THE INVENTION

Dynamic pulse width modulation (PWM) amplifiers are provided. An exemplary embodiment of a dynamic PWM amplifier comprises an input terminal, a dynamic PWM controller, a power stage, a low pass filter, and an output terminal. The input terminal receives an input signal. The dynamic PWM controller transforms the N-bit input signal sampled by a sampling frequency to a 1-bit PWM signal. The power stage receives and outputs the 1-bit PWM signal. The low pass filter receives and outputs the 1-bit PWM signal from the power stage. The 1-bit PWM signal is used to drive the power stage and the low pass filter. The output terminal outputs the 1-bit PWM signal. The dynamic PWM amplifier is characterized in the dynamic PWM amplifier uses a register array to store the input signal processed immediately in each frame, regroups the input signal, and outputs the regroup signal, so that the 1-bit PWM signal is changed according to the input signal.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present application will become more fully understood from the subsequent detailed description and the accompanying drawings, which are given by way of illustration only, and thus are not limitative of the present invention, and wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
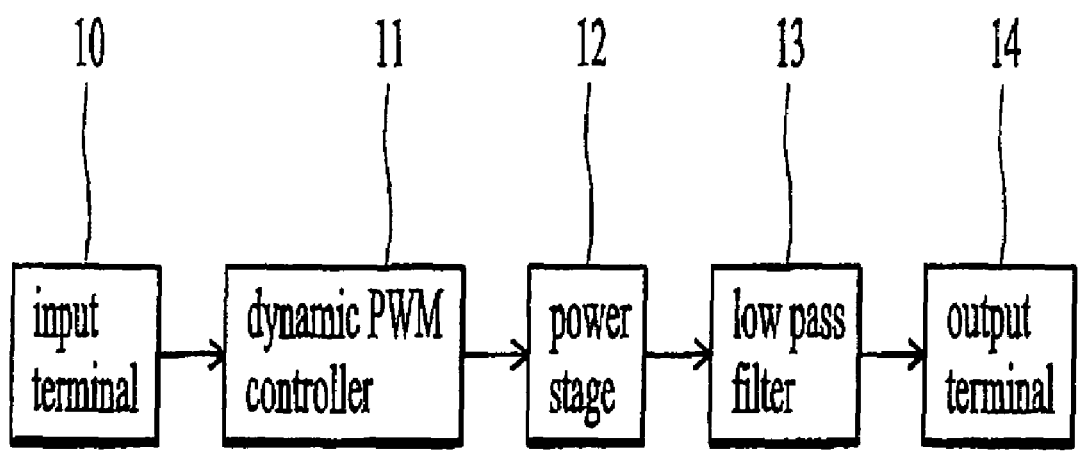
FIG. 1 depicts an embodiment of a dynamic PWM power amplifier.

Dynamic pulse width modulation (PWM) controllers are provided and applied in audio amplifiers, power amplifiers, and DC/DC (direct current to direct current) converters. FIG. 1 shows an embodiment of a dynamic PWM power amplifier according to. When a signal is input to a dynamic PWM controller 11 through an input terminal 10, the N-bit input signal sampled by sampling frequency fs Hz is transformed to a 1-bit PWM signal, so that a power stage 12 and a low pass filter 13 are driven to output the 1-bit PWM signal through an output terminal 14.

Figure 2:
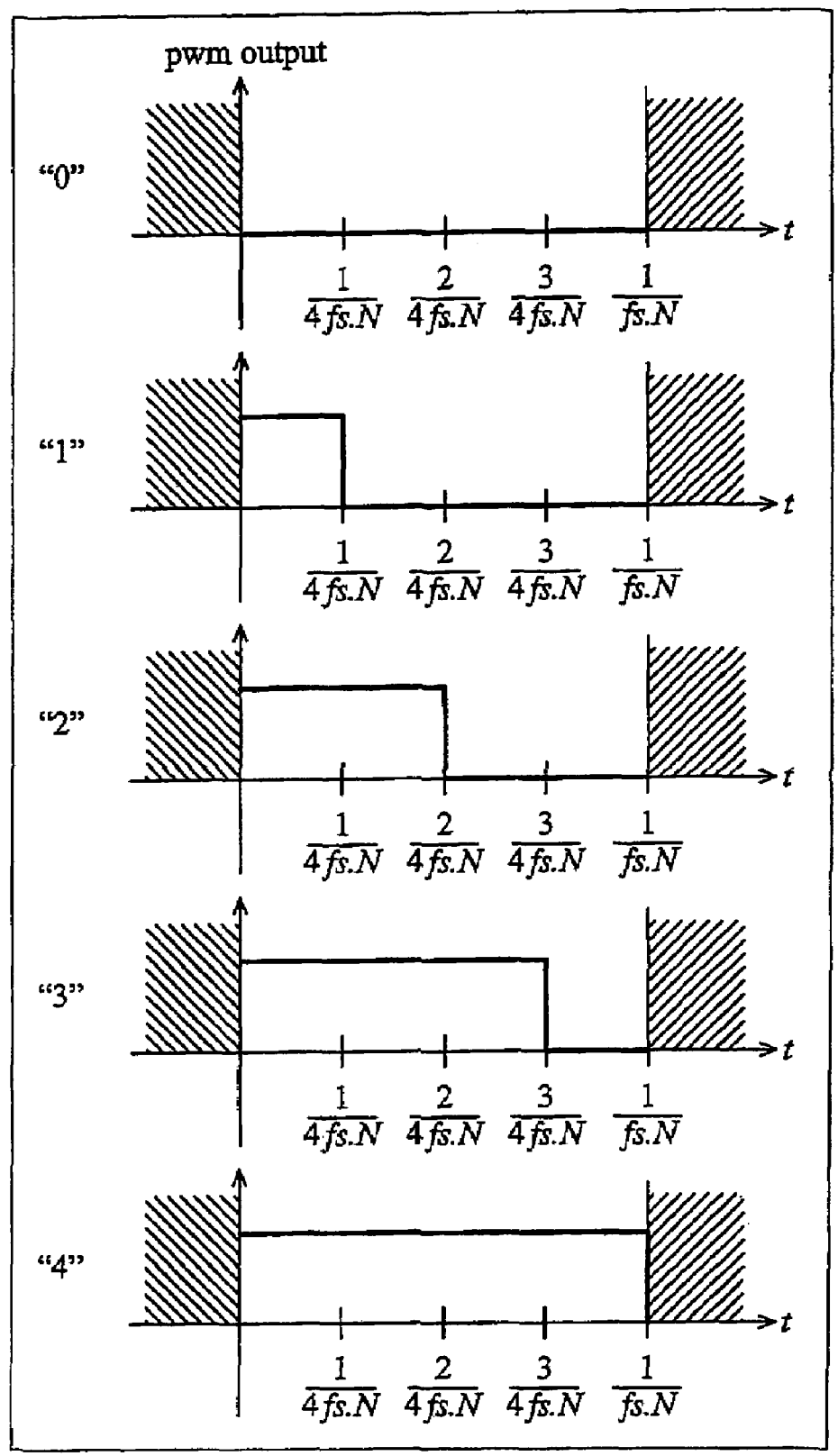
FIG. 2 depicts an embodiment of the PWM modulation.

As shown in FIG. 2, it is assumed that a carrier of the PWM signal is at Nfs Hz. In the modulation of the PWM signal, the L-bit or M-level of a quantizer is transformed to 1-bit, wherein the smallest values of L and M are respectively 1 and 2. For example, a signal of 5-level (M=5) has five outputs, labeled by "0", "1", "2", "3", and "4" in FIG. 2. The PWM signal switches between zero (0) and one (1) each $$\frac{1}{Nfs}S$$

(second) at most. The smallest width of the pulse is $$\frac{1}{4Nfs}S.$$

For a PWM output amplifier, if better tone quality is desired, the easiest method is to increase the multiple (N) of the carrier of the PWM signal or the quantification order (L or M). This method results in the requirement for greatly increased speed of the power stage 12. It is assumed that the sum of rise time and fall time is equal to $$\frac{1}{10}$$

of the width of one pulse. When N is equal to 64, M is equal to 5, and fs is equal to 48 k Hz, the sum of the rise time and fall time is 8.138 ns. If the rise time is equal to the fall time, each of them is equal to 4.069 ns. For crystals of a general power amplifying stage, it is hard to reach 4.069 ns. In the process of quantification, when the input signal is smaller, the widths of pulses of zero (0) and one (1) are closer in a period of $$\frac{1}{Nfs},$$

as shown in "2" in FIG. 2. When the input signal is largest, the width of the pulse is largest, as shown speed in "0" and "4" in FIG. 2. In this conditions of "0" and "4", the requirement for the crystals of the power stage is degraded, and the PWM signal is not modulated unless it is necessary. Conditions of "1", "2", and "3" in FIG. 2 are solved by an embodiment of the invention due to the requirement for the high speed of the power stage. According to the previous setting, an over sampling multiple is set to N, the number of stages of output is M, and sampling frequency is Fs. The smallest width of the pulse is equal to $$\frac{1}{N(M-1)Fs}S.$$

If the pulse with the smallest width is set as a unit pulse, the widths of the pulse of "0" and "M−1" are equal to M−1, those of "1" and "M−2" are equal to 1, those of "2" and "M−3" are equal to 2, and so on. The smaller the width is, the higher the speed required. It is assumed that the width of M−1 unit pulses are set a frame and the desired smallest width of the pulse is equal to the width of K unit pulses, wherein $$1 \le k \le \frac{M-1}{2}.$$

The desired speed of the power stage is reduced by K times. To make the smallest width of the pulse equal to K, a plurality of frames are combined, and a dynamic PWM control method is performed as described in the following paragraphs.

Figure 3:
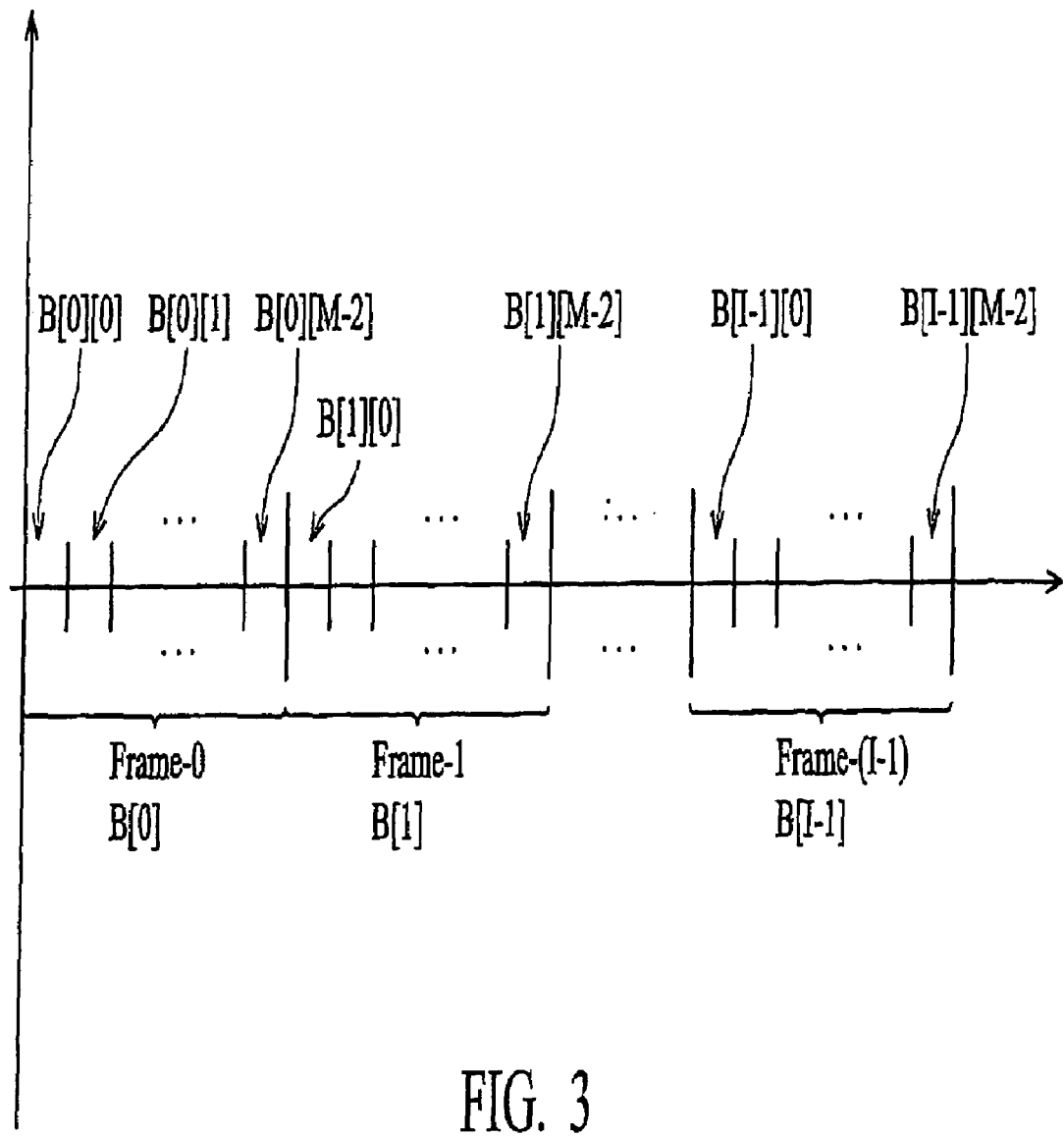
FIG. 3 depicts an embodiment of the PWM modulation by a register array.
Figure 4:
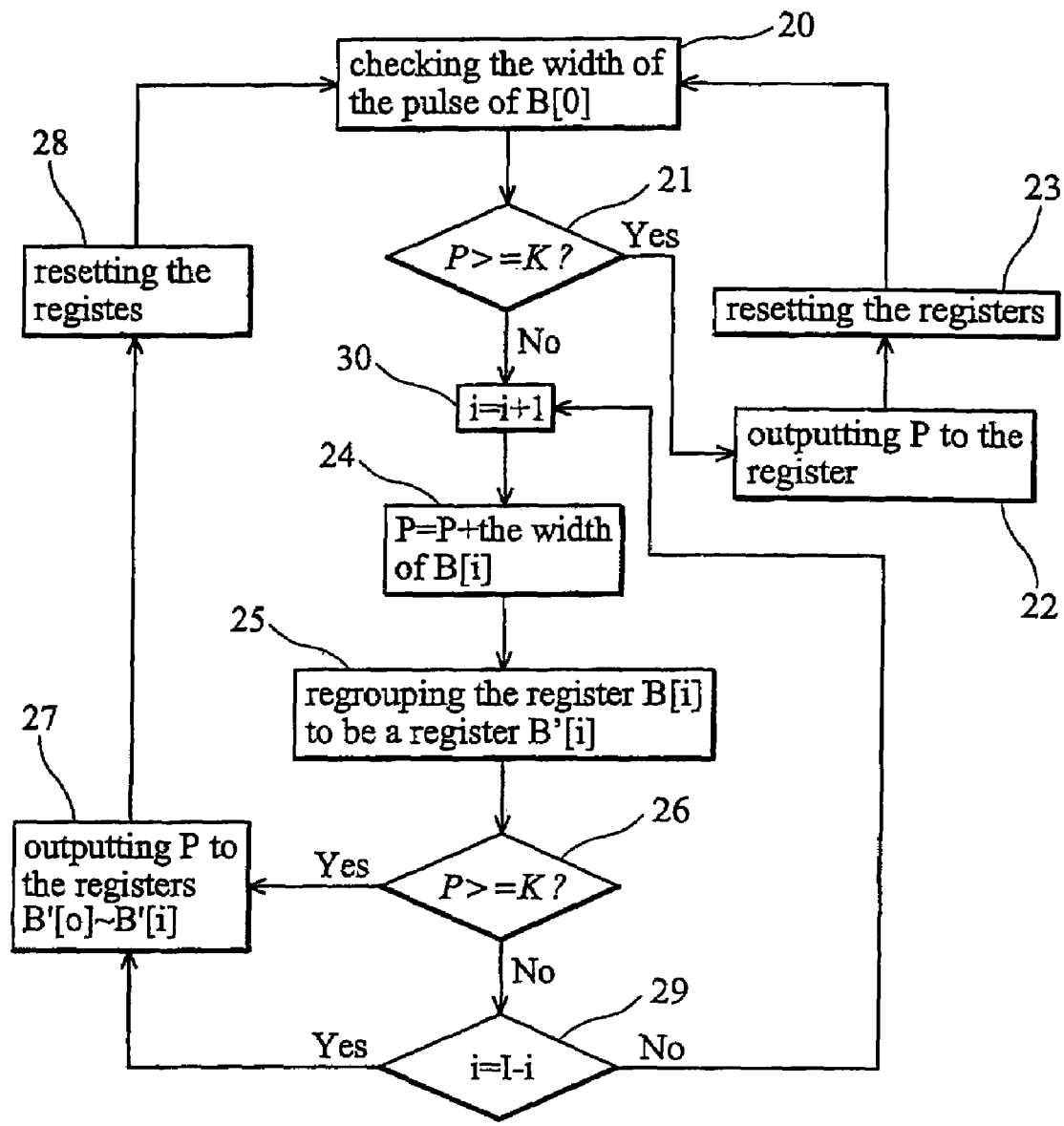
FIG. 4 is a flow chart of an embodiment of a dynamic PWM control method.

As shown in FIG. 3, (M−1)-bit registers B[0] to B[I−1] is used, wherein I≧2. B[0] stores an immediately processed frame, B[1] stores a frame output at a next time point, B[2] stores a frame output at the next time point to B[1], and so on. Bits of each register represent that the output is at a high level (1) or a low level (0) at this time point. FIG. 4 is a flow chart of an embodiment of a dynamic PWM control method. A PWM signal is stored in a register array, and the width of the pulse of the first register B[0] is checked (step 20). At this time, i is set to 0, and P represents the width of the pulse of B[0]. It is determined whether P≧K is established or not (step 21). If P≧K is established, the value of P is output to the register B[0] (step 22). Then, the registers are reset and shifted forward (step 23), so that B[0]=B[1], B[1]=B[2], B[I−2]-B[I−1], and so on. A new value is loaded to B[I−1]. If P≧K is not established, i=i+1 (step 30), that is the combination of the pulses of the first and second registers B[0] and B[1]. Then, P is equal to P plus the width of the pulse of the register B[i] (step 24). The register B[i] is regrouped as a register B'[i] (step 25), meaning that ones (1s) of the registers B[0] to B[i] are grouped as a series of ones (1s), and zeros (0s) of the registers B[0] to B[i] are grouped as a series of zeros (0s). The regrouping results are stored in the registers B'[0] to B'[i]. It is determined whether P≧K is established or not again (step 26). If P≧K is established, the value of P is output to the registers B'[0] to B'[i] (step 27). Then, the registers are reset (step 28), so that B[0]=B[i+1], B[1]=B[i+2], B[I-2]-B[I+i], and so on. If P≧K is not established, it is determined i=I-1 is established or not (step 29). It i=I-1 is established, P is output to the registers B'[0] to B'[i] (step 27). Then, the registers are reset and shifted forward (step 28), so that B[0]=B[i+1], B[1]=B[i+2], B[I-2]-B[I+i], and so on. If i=I-1 is not established, the flow path is returned back to step 30. If the sum of the widths of the pulses of all registers is still smaller than K, the combined pulse is output, and a new value is loaded in the register array.

Figure 5:
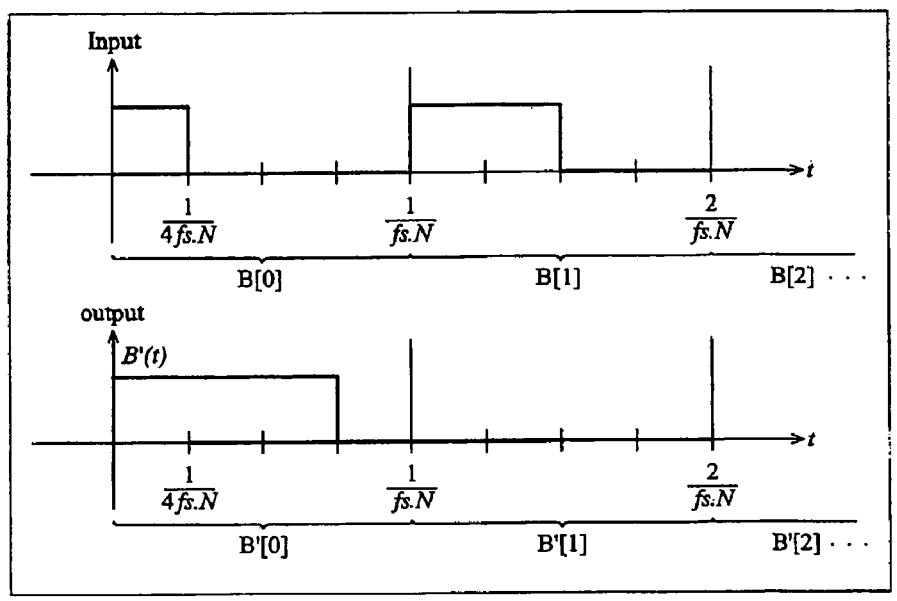
FIG. 5 depicts the PWM modulation according to the dynamic PWM control method of FIG. 4.

FIG. 5 shows an input signal and an output signal according to the embodiment of a dynamic PWM control method when I=2, M=5, and k=2.

Figure 6:
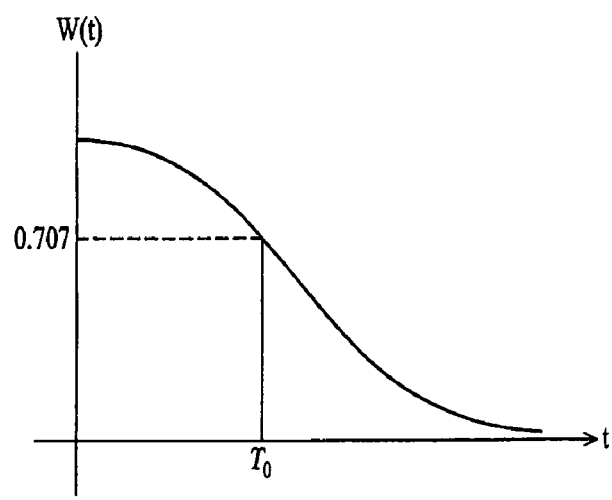
FIG. 6 depicts a power packet of normal analog low pass filter.

The speed of the power stage is reduced to a half of the original speed. Note that when this system is desired to operate in an optimum state, the value of I is large enough, avoiding the insufficiency of the register array when the sum of the widths of the pulses does not yet reach the determined K. According to the previously set values, if B[0]=0×1000 and B[1]=0×0000, P=1<K=2. Thus, the output signal has serious distortion according to the embodiment of the method. However, the distortion does not affect the system because the analog low pass filter can serve as an integrator with a windowing effect. In general, the power half-life of the windowing effect is generally far longer than the time of the register array. The form of the window is assumed as shown in FIG. 6, and $$T_0 \gg I \cdot \frac{1}{N \cdot Fs},$$

wherein $T_0$ represents the time point of the half-life. The final output signal is represented by the simple mode:

$$x'(t) = \int_{-\infty}^{t} B'(t-\tau)W(\tau)d\tau$$
$$\approx \int_{-\infty}^{\infty} B(t-\tau)W(\tau)d\tau$$
$$= x(t)$$

Since the changed range is from B(t) to B'(t) and limited in $$\frac{1}{N \cdot Fs},$$

the distortion effect is reduced.

The dynamic PWM control method and the PWM controller according to the invention are not only applied in an audio frequency amplifier, but also in high-low voltage power amplifier and a DC power amplifier. The PWM controller can output voltage in the form of constant voltage signal, reducing high frequency oscillation, enhancing product efficiency, and extending product life.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A dynamic pulse width modulation (PWM) amplifier, comprising:
    an input terminal receiving an input signal;
    a dynamic PWM controller transforming an N-bit input signal sampled by a sampling frequency to a 1-bit PWM signal, wherein N is an integer greater than or equal to one;
    a power stage receiving and outputting the 1-bit PWM signal;
    a low pass filter receiving and outputting the 1-bit PWM signal from the power stage, wherein the 1-bit PWM signal is used to drive the power stage and the low pass filter; and
    an output terminal outputting the 1-bit PWM signal;
    wherein the dynamic PWM amplifier is characterized in the dynamic PWM amplifier uses a register array to store the input signal processed immediately in each frame, regroups the input signal, and outputs the regroup input signal, so that the 1-bit PWM signal is changed according to the input signal.

2. The dynamic PWM amplifier as claimed in claim 1, wherein the dynamic PWM amplifier is a low-voltage audio frequency amplifier.

3. The dynamic PWM amplifier as claimed in claim 1, wherein the dynamic PWM amplifier is a low-voltage power amplifier.

4. The dynamic PWM amplifier as claimed in claim 1, wherein the dynamic PWM amplifier is a high-voltage power amplifier.

5. The dynamic PWM amplifier as claimed in claim 1, wherein the dynamic PWM amplifier is a DC power amplifier.

* * * * *